United States Patent
Foltin et al.

(10) Patent No.: US 9,972,387 B2
(45) Date of Patent: May 15, 2018

(54) SENSING CIRCUIT FOR RESISTIVE MEMORY

(71) Applicant: HEWLETT PACKARD ENTERPRISE DEVELOPMENT LP, Houston, TX (US)

(72) Inventors: Martin Foltin, Fort Collins, CO (US); Yoocharn Jeon, Palo Alto, CA (US); Brent Buchanan, Palo Alto, CA (US); Erik Ordentlich, San Jose, CA (US); Naveen Muralimanohar, Santa Clara, CA (US); James S. Ignowski, Fort Collins, CO (US); Jacquelyn M. Ingemi, Fort Collins, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days. days.

(21) Appl. No.: 15/325,040

(22) PCT Filed: Oct. 31, 2014

(86) PCT No.: PCT/US2014/063330
§ 371 (c)(1),
(2) Date: Jan. 9, 2017

(87) PCT Pub. No.: WO2016/068980
PCT Pub. Date: May 6, 2016

(65) Prior Publication Data
US 2017/0206956 A1    Jul. 20, 2017

(51) Int. Cl.
*G11C 11/00*        (2006.01)
*G11C 13/00*        (2006.01)
(52) U.S. Cl.
CPC ........ *G11C 13/004* (2013.01); *G11C 13/0059* (2013.01); *G11C 13/0061* (2013.01);
(Continued)

(58) Field of Classification Search
CPC .............. G11C 13/004; G11C 13/0059; G11C 13/0061; G11C 13/0069; G11C 13/0097; G11C 2013/0054
(Continued)

(56) References Cited

U.S. PATENT DOCUMENTS 8,116,126 B2    2/2012    Breitwisch et al.
8,755,214 B2    6/2014    Frey et al.
(Continued)

FOREIGN PATENT DOCUMENTS

EP    1383132 A1    1/2004
TW    200305876    11/2003
(Continued)

OTHER PUBLICATIONS

International Search Report and Written Opinion; PCT/US2014/063330; dated Jul. 8, 2015; 12 pages.
(Continued)

*Primary Examiner* — Fernando Hidalgo
(74) *Attorney, Agent, or Firm* — Tarolli, Sundheim, Covell & Tummino L.L.P.

(57) ABSTRACT

This disclosure provides a circuit that includes a ramp generator to apply a voltage ramp to a resistive memory cell. A sensing circuit can enable the ramp generator and monitor a current output received from the resistive memory cell in response to the applied voltage ramp, wherein the sensing circuit compares the current output to a predetermined current threshold to determine the state of the resistive memory cell.

13 Claims, 5 Drawing Sheets

(52) U.S. Cl.
CPC ...... *G11C 13/0069* (2013.01); *G11C 13/0097* (2013.01); *G11C 2013/0054* (2013.01)

(58) Field of Classification Search
USPC ........................................................ 365/148
See application file for complete search history.

(56) References Cited

U.S. PATENT DOCUMENTS

| | | |
|---|---|---|
| 9,343,133 B1 * | 5/2016 | Sanasi ................. G11C 11/1675 |
| 2006/0044878 A1 | 3/2006 | Perner |
| 2010/0078723 A1 | 4/2010 | Bertin et al. |
| 2012/0063195 A1 | 3/2012 | Lam et al. |
| 2013/0200937 A1 | 8/2013 | Patil et al. |
| 2013/0235651 A1 | 9/2013 | Perner et al. |
| 2014/0192585 A1 | 7/2014 | Hashim et al. |

FOREIGN PATENT DOCUMENTS

| | | |
|---|---|---|
| TW | 200729227 | 8/2007 |
| TW | 201303885 | 1/2013 |
| WO | WO-98/33184 | 7/1998 |
| WO | WO-2014-066462 A2 | 5/2014 |

OTHER PUBLICATIONS

Kang, W. et al., High Reliability Sensing Circuit for Deep Submicron Spin Transfer Torque Magnetic Random Access Memory, (Research Paper), Retrieved Sep. 29, 2014, 2 Pages.

\* cited by examiner

SENSING CIRCUIT FOR RESISTIVE MEMORY

BACKGROUND

Resistive random-access memory (RRAM or ReRAM) is a type of non-volatile (NV) random-access (RAM) memory that operates by changing the resistance across a dielectric solid-state material often referred to as a memristor. The dielectric, which is normally insulating, can be made to conduct through a filament or conduction path formed after application of a sufficiently high programming voltage. The conduction path can arise from different mechanisms, including vacancy or metal defect migration, for example. When the filament is formed, it may be RESET (e.g., broken, resulting in high resistance) or SET (e.g., reformed, resulting in lower resistance) by another voltage. After a memory cell has been programmed to a high or low resistance state representing the logic state of the cell, read voltages (lower than the programming voltage) can be applied to the cell to determine its respective resistance state (e.g., apply a fixed read voltage to the cell and read current from cell to determine resistance state).

DETAILED DESCRIPTION

This disclosure relates to a sensing circuit that operates to more accurately read resistive memory cells in view of process variation. The sensing circuit can vary a read voltage to the cell at a predetermined rate. For example, the sensing circuit can provide a ramp signal that varies at substantially constant ramp rate. The sensing circuit then compares received output current from the cell in response to the applied voltage ramp relative to a threshold. The time elapsed to reach one or more respective current thresholds can be utilized to determine the state of the memory cell.

Conventional resistive memory cells typically suffer from considerable variation of fixed selector threshold voltages for reading the cell and resistor set/reset voltages for programming the cells. An industry standard approach for reading a memory cell state is to compare cell current against a fixed current threshold at a fixed sense voltage. However, since the read current depends on the difference between sense voltage and selector threshold voltage, incorrect logic states can be sensed if selector threshold current is too high or too low due to process variation. Furthermore, the cell can be erroneously set or reset during read operation, losing its state. The sensing circuit disclosed herein is tolerant to selector threshold as well as to resistor set and reset voltage variations. The resistive memory cells described herein can provide a non-linear I (V) characteristic with very low current under a threshold voltage Vth, where a read voltage Vread applied to the memory cell to determine its logic state should be higher than Vth. The read margin for reading the memory cell improves with increasing the difference between Vread and Vth. One example circuit disclosed herein for achieving high I (V) curve nonlinearity includes placing a cell selector with threshold voltage Vt in series with the resistive memory element to facilitate reading the cell.

Figure 1:
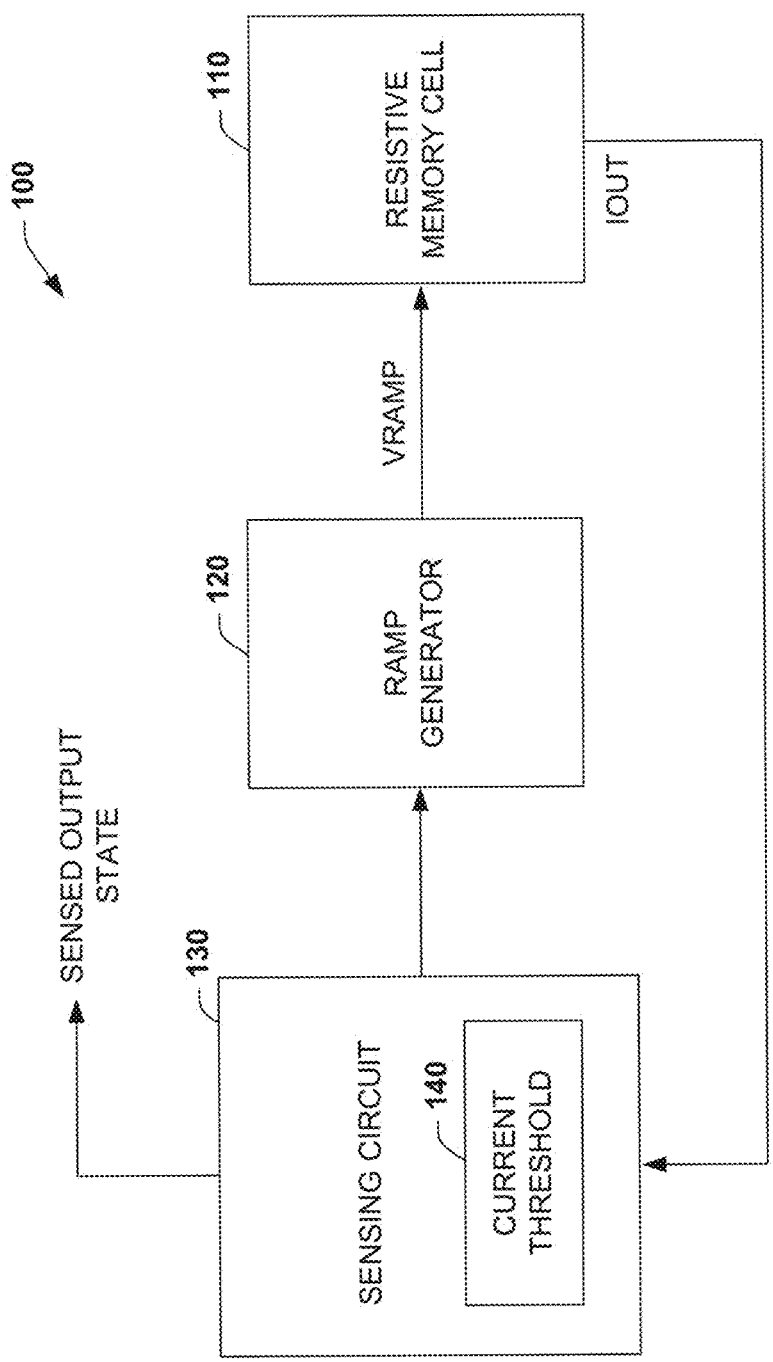
FIG. 1 illustrates an example of a circuit for reading data from a resistive memory cell utilizing a varying sensing voltage applied to the cell.

FIG. 1 illustrates an example of a circuit 100 for reading data from a resistive memory cell 110 utilizing a time varying sensing voltage applied to the cell. The circuit 100 includes a ramp generator 120 to apply a voltage ramp signal (VRAMP) to the resistive memory cell 110. The voltage ramp signal can be a linearly varying signal (e.g., linearly increasing signal). Although only a single cell is shown for the resistive memory cell 110, a plurality of such cells can be provided each of which can be operated similarly to as disclosed with respect to the cell 110. A sensing circuit 130 enables the ramp generator (e.g., generates a starting logic event) and monitors a current output (IOUT) received from the resistive memory cell 110 in response to the applied voltage ramp VRAMP. The sensing circuit 130 compares the current output IOUT to a predetermined current threshold 140 (or current thresholds) to determine the state of the resistive memory cell 110.

By way of example, the sensing circuit 130 includes a timer (not shown) to determine a time for the current output IOUT to change a predetermined amount corresponding to the predetermined current threshold. The duration determined by the sensing circuit corresponds to the slope (e.g., a rate of change) of the current output IOUT that is being measured for a respective memory cell. As a further example, the sensing circuit 130 can employ two or more thresholds, where the sensing circuit can detect the state of the memory cell 110 based on the time for IOUT to travel between multiple current thresholds, which corresponds to the rate of change (e.g., the slope) of IOUT. For instance, when the first current threshold 140 is reached, timing operations in the sensing circuit 130 can commence. The activation of timing has the effect of measuring the rise time of the output current IOUT to change from the first threshold to another threshold, which corresponds to the slope. For instance, a faster rise time for IOUT indicates a low resistance state has been programmed in the memory cell 110, whereas a slower rise time indicates that a high resistance state has been programmed. This measurement by the sensing circuit 130 can be performed at lower voltages than fixed voltage sensing of conventional systems which has the effect of improving read performance and the associated tolerance to process variations.

The resistive memory cell 110 can be programmed to one of two or more memory states. For example, one memory state can be a low resistance state (LRS) and another memory state can be a high resistance state (HRS), for example. In other examples, resistance in between the LAS and the HRS can be programmed providing the memory cell with the ability to store more than two binary states. Depending on the programmed state of the resistive memory cell 110, the current output from the cell will provide a current slope (e.g., rate of change in IOUT) that is higher (e.g., faster current/sec change) or lower (e.g., slower current/sec change) in response to the ramp signal VRAMP applied to the cell. For example, if the resistive memory cell 110 is programmed to the LRS, the current output IOUT would have a higher current change per second (e.g., higher slope) than if programmed at the HRS since the lower resistance of the LRS would supply higher output current as the ramp is increased.

By utilizing the ramp voltage VRAMP to excite the memory cell 110 during read operations in contrast to a fixed voltage excitation, the memory bit error rate can be improved at the presence of selector threshold and resistor set and reset voltage variation caused by process variation. Ramp excitation of the memory cell 110 and sensing also mitigates erroneous set or reset of the memory cell during the read operation. This in turn reduces the number of memory cells and arrays of cells that need to be fenced off (e.g., disabled) due to poor read margin and/or read disturb, thereby increasing memory density. The approach disclosed herein is more tolerant to Vt and VSET or VRESET variation than approaches using fixed sensing voltage to read the state of a cell. As used herein, the term VSET refers to the voltage to cause a given memory cell to be placed in the high resistive state. The term VRESET refers to the voltage to cause a given memory cell to be place in the low resistance state. The term Vt refers to the voltage at which a cell selector (e.g., switch) in series with a given memory cell causes cell conduction.

Figure 2:
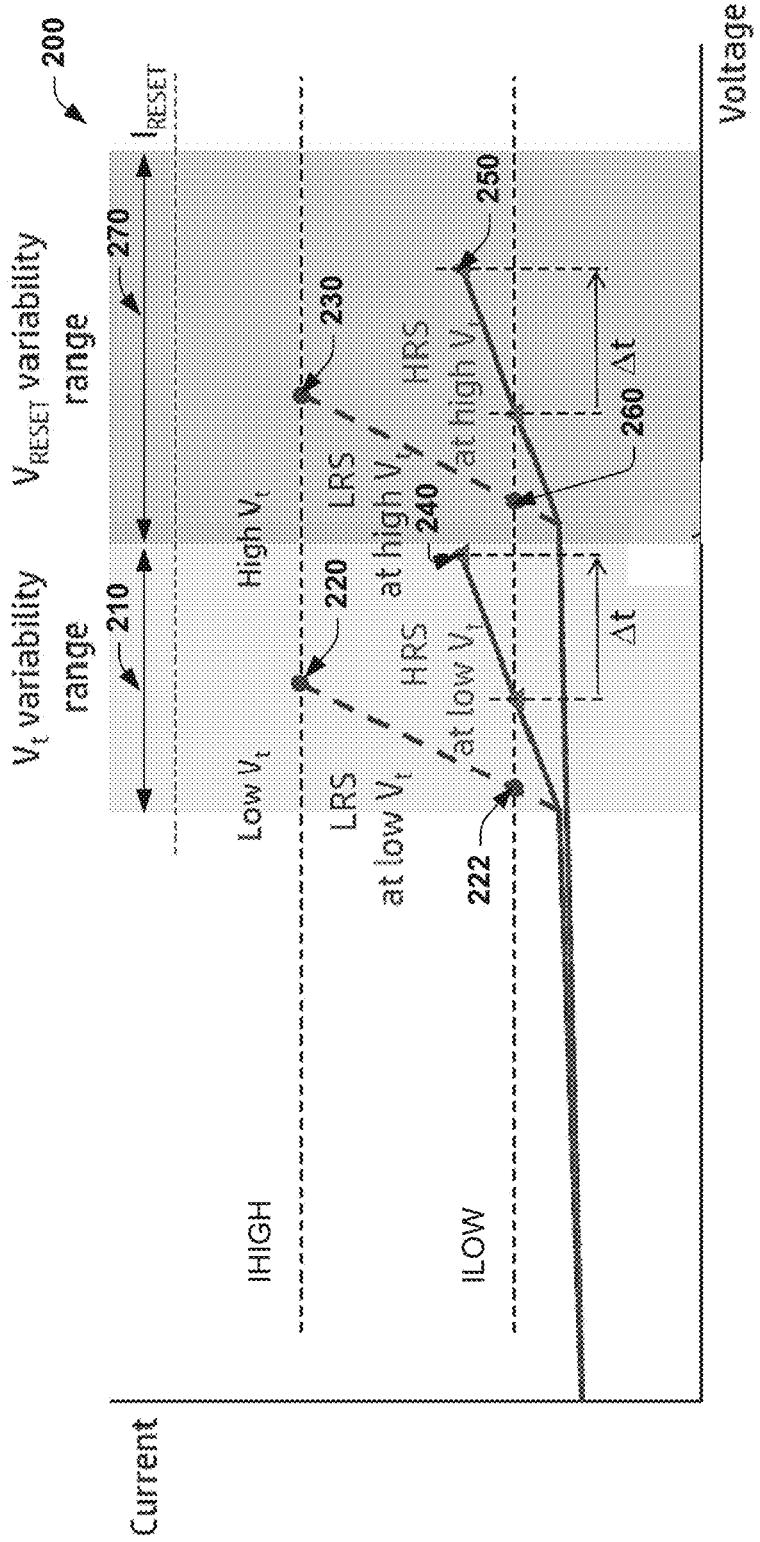
FIG. 2 illustrates an example of voltage and current excitation diagram that can be employed to analyze a resistive memory cell.

FIG. 2 illustrates an example of voltage and current excitation diagram 200 that can be employed to analyze a resistive memory cell. In this example, excitation voltage applied to a memory cell (e.g., by ramp generator 120) is shown on the horizontal axis and the resultant output current received from the memory cell at the respective excitation voltage is shown on the vertical axis. For a voltage segment shown at 210 representing variances in threshold voltage Vt described above, a low resistance state (LRS) is detected at 220 when output current from the memory cell passes a reference threshold, shown as HIGH. As a further example, the time difference (e.g., the elapsed time ($\Delta t$)) from the output current IOUT crossing a low reference current threshold ILOW until it crosses the other reference threshold IHIGH is less than a prescribed time threshold (e.g., corresponding to a fixed amount of delay), thereby indicating a high rate of change for the sensed current in response to VRAMP, which corresponds to the LRS. If Vt is varied to a higher value, corresponding to a voltage reset variability range, the LRS detection point moves to 230 in response to the sensed output current IOUT increasing between IL to IH in response to the ramp signal VRAMP.

Similarly, at lower values of Vt corresponding to the Vt variability range 210, a high resistance state (HRS) is detected in response to the output current IOUT received from the cell passing current threshold ILOW and not reaching threshold IHIGH within a prescribed time threshold for $\Delta t$. That is, if the range of change in output current IOUT (e.g., its slope) is sufficiently low such that the prescribed time elapses occurs before reaching HIGH, the sensing circuit determines the cell is in the HRS. Similarly, if the ramp voltage is increased (e.g., to operate within the voltage reset variability range), the HRS is detected at 250 in response to reaching the prescribed time threshold before reaching HIGH. Note that at 240 and at a lower value of Vt in range 210, the output current sensed at the memory cell is higher than output current sensed at 260 which represents current from a LRS cell at a higher value of Vt. Thus, in this example, if fixed values of voltages were used to excite the memory cell (e.g., as in existing approaches) and depending on where those threshold values are set, it is possible to misidentify an LRS for a HRS and vice versa.

A Vreset variability range at 270 illustrates that a wide range of Vt variation can be accommodated which mitigates the risk of hitting Vreset—unlike conventional fixed voltage bias reading circuits. In a conventional fixed voltage reading circuit, a fixed bias voltage is applied to the cell and the resulting current is monitored and compared with a reference current. To facilitate that the LRS at 230 is measured correctly (e.g., for cells with high Vt's), a high voltage such as the example voltage at 230 should be applied. This high voltage would be too high for cells that have low Vt's such as a cell that has its LRS read point at 220, for example, and thus the cell would be reset (flipped) by such a high fixed bias voltage.

With respect to the circuits disclosed herein, the voltage ramp is stopped when the output current reaches HIGH. Since the read operation is carried out in the RESET polarity, a high voltage in VRAMP will not disturb already reset cells. Read disturb can happen to set cells, but the cut-off mechanism (e.g., delay timer) that is activated when the current output reaches HIGH prevent cell setting from occurring. Since IHIGH is lower than the switching threshold current, the circuits and method disclosed herein mitigate the risk of read disturb that can be encountered with fixed bias voltage cell reading.

Rather than read the LRS or HRS programmed at a given cell with a fixed voltage, the circuits and methods described herein measure slope for the output current to discriminate between the LRS and the HRS when excited by a variable voltage such as a ramp, for example. As can be observed from the diagram 200, a steeper slope is generated from a cell programmed in an LRS versus a cell programmed in an HRS—regardless of the voltage range that is applied to read the cell. By dynamically exciting and reading the output current from cell to determine its respective slope response, the circuits described herein can distinguish between LRS and HRS even if process variations cause the value of received currents to change at a given applied voltage.

Figure 3:
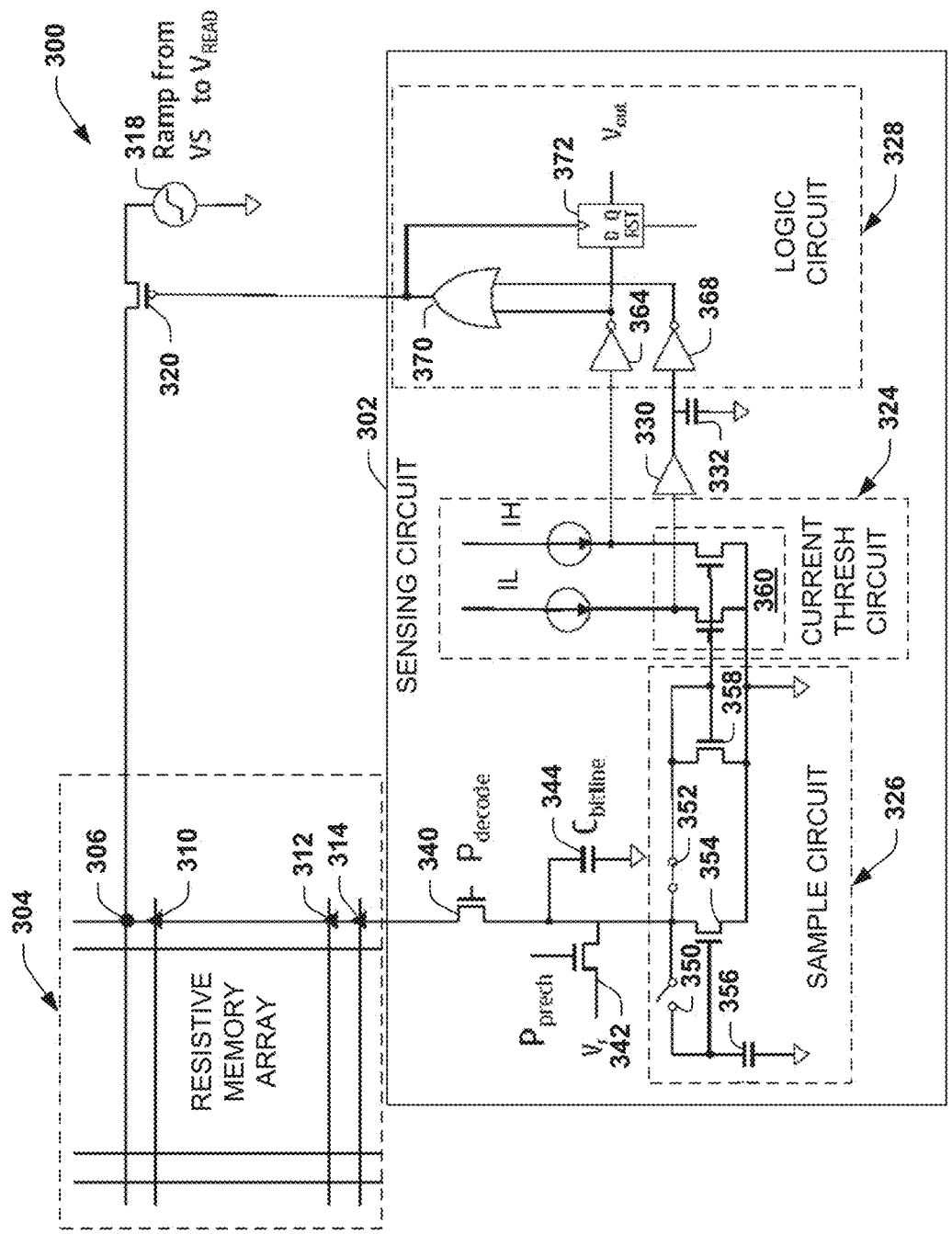
FIG. 3 illustrates an example of circuit that includes a sensing circuit for reading data from a resistive memory cell utilizing a varying sensing voltage applied to the cell.

FIG. 3 illustrates an example of circuit 300 that includes a sensing circuit 302 for reading data from a resistive memory array 304 utilizing a varying sensing voltage applied to the cell. The resistive memory array 304 can be configured as horizontal cross-point array that includes a plurality of resistive memory cells, for example. An example readout resistive memory cell is shown at cross-point 306. Points 310, 312, and 314 represent example sneak-path currents that can flow in the array 304 when the cell 306 is selected for reading. A ramp generator 318 applies a voltage ramp via switch 320 to the resistive memory cell 306. The ramp can start at a starting voltage VS and ramp up to a value noted as VREAD. For example, the ramp generator 318 provides the ramp voltage as a linearly increasing ramp voltage from VS to VREAD. The starting voltage VS can be selected such as to overcome the sneak-path currents generated when the cell 306 is read. A current threshold circuit 324 receives a current output from the resistive memory cell 306 via sample circuit 326 in response to the applied voltage ramp from generator 318. In one example, the sensing circuit 302 can be provided as part of a controller circuit to read resistive memory array 304.

The current threshold circuit 324 compares the current output from the resistive memory cell 306 to a high threshold current (IH) and a low threshold current (IL), such as can be fixed reference current thresholds IH and IL. When sampled current from cell 306 reaches IL, this generates a logic event that starts to propagate through the delay line of buffer 330 and capacitor 332 with fixed delay (e.g., predetermined delay based on values of buffer output resistance and capacitor). A logic circuit 328 receives a logic event (e.g., generated when sampled current from cell reaches IL) that propagates though a delay line. The delay line can be formed from a buffer 330 (e.g., its output resistance) and capacitor 332. Other types of delay lines could be implemented. The delay line can be configured to provide a prescribed time threshold, such as described with respect to FIG. 1. The state of the resistive memory cell 306 can be determined as a high resistance state (HRS) if the current output reaches the high threshold current after the logic event propagates though the delay line.

That is, the logic event triggers the logic signal to propagate through the delay line in response to the sampled current from the cell 306 reaching the low current threshold IL. The detection of crossing IL is delayed by the delay line (e.g. buffer 330 and capacitor 332) to implement a prescribed time threshold. Thus, the logic circuit 328 can determine the state of the resistive memory cell 306 as a low resistance state (LRS) if the current output from the cell reaches the high threshold current IH before the logic event propagates through the delay line formed from buffer 330 and capacitor 332. If the signal, corresponding to the sampled output current crossing IL, propagates through the delay line before the current output crosses IH, the logic circuit 328 detects the HRS.

By way of further example, the circuit action started by the logic event when the current output crosses IL can be conceived as a start time for a stop watch. If the sensed current reaches IH before the logic event reaches the end of the delay line (e.g., the stop watch end), the state is resolved as LRS. Conversely, if the logic event reaches the end of the delay line before the sensed current reaches IH, the state is resolved as HRS. If the sensed current does not reach IH, the state is also resolved as HRS. This allows high variation of HRS state resistance. The sensing can be performed in the reset voltage direction for example, where the reference current IH is lower than the reset current IRESET. For example, IH can be ~80% of lowest IRESET at five sigma variation for sufficient margin. The VREAD voltage ramp stops when cell current reaches IH. This facilitates that the read operation does not set or reset the memory cell 306 during reads (e.g., it mitigates read disturb conditions of fixed voltage sensing circuits).

Other components of the sensing circuit 302 can include a switch 340 to select the cell 306 in response to a Pdecode signal (e.g., from a controller). Transistor 342 can be selected (in response to Pprech signal) to apply a pre-charge voltage to the selected cell. A bitline capacitor 344 compensates for bit-line capacitance of the selected cell.

The sample circuit 326 can include a sample and hold formed from switches 350 and 352, transistor switch 354, and capacitor 356. The sample and hold can be utilized for sneak current subtraction via correlated double sampling, for example. While the cell voltage is VS, the sample and hold samples the sneak current. Then, while the cell is ramped from VS to VREAD, the sample and hold holds and subtracts the sneak current from the cell current. Output from the sample and hold is fed to amplifier 358 which provides sampled output current from the cell 306 to the current threshold circuit 324. The current threshold circuit 324 can include a current mirror 360 which compares sampled cell current with predetermined reference currents IH and IL to drive inputs to the logic circuit in response to the output current reaching each respective reference current IH and IL. The logic circuit 328 includes inverters 364 and 368 in response to the signals from the current mirror. The inverter 368 receives the delayed signal from the delay line. Based on the signals from the comparison implemented by circuitry 360, the inverters 364 and 368 drive OR gate 370 and flip flop 372 which latches the logic state of the cell 306 depending on whether the LRS or the HRS is detected (e.g., LRS equals logic zero and HRS equals logic one).

Instead of measuring cell current at a fixed read voltage, the sensing circuit 302 measures a current slope in the current versus voltage dependence. For example, in the circuit 300, the voltage ramp generated at 318 can linearly increase with time at a fixed rate. Irrespectively of the range of the starting voltage from the ramp generator 318, as described above, the measured current slope will be higher for the LRS state than for the HRS state (See e.g., FIG. 2), mitigating erroneous read of the cell 306. To measure the current slope, VREAD applied to the cell via ramp generator 318 is varied over time where the sensing circuit 302 measures the rate of current increase over time.

Figure 4:
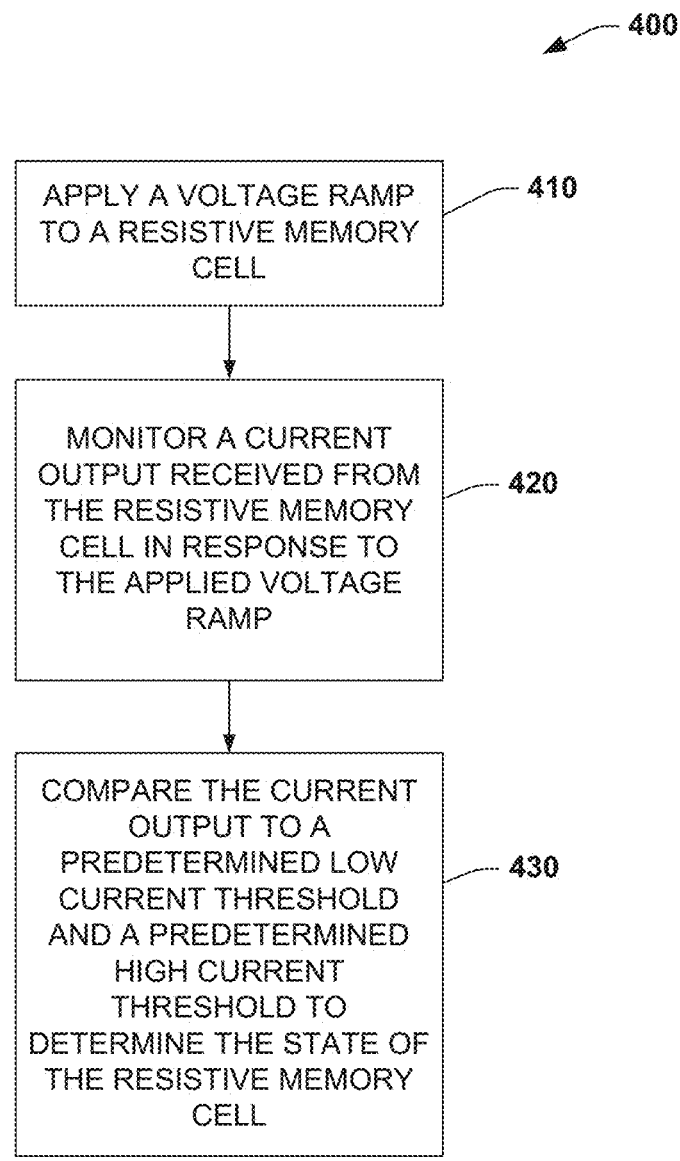
FIG. 4 illustrates an example of a method for reading data from a resistive memory cell utilizing a varying sensing voltage applied to the cell.

In view of the foregoing structural and functional features described above, an example method will be better appreciated with reference to FIG. 4. While, for purposes of simplicity of explanation, the method is shown and described as executing serially, it is to be understood and appreciated that the method is not limited by the illustrated order, as parts of the method could occur in different orders and/or concurrently from that shown and described herein. Such method can be executed by various components and executed by an integrated circuit, computer, or a controller, for example.

FIG. 4 illustrates an example of a method 400 for reading data from a resistive memory cell utilizing a varying sensing voltage applied to the cell. At 410, the method 400 includes applying a voltage ramp to a resistive memory cell (e.g., via sensing circuit 130 and ramp generator 120 of FIG. 1). At 420, the method 400 includes monitoring a current output received from the resistive memory cell in response to the applied voltage ramp (e.g., via sensing circuit 130). At 430, the method 400 includes comparing the current output to a predetermined low current threshold and a predetermined high current threshold to determine the state of the resistive memory cell (e.g., via sensing circuit 130). The comparison at 430 can be employed to measure a rise time of the current output with respect to the applied ramp voltage. For instance, the method 400 can also include determining an LRS if the current output reaches the high current threshold before a logic event propagates through a delay line. The state of the resistive memory cell is determined as a high resistance state (HAS) if a logic event (corresponding to the current output reaching a low current threshold) propagates though the delay line before the current output reaches the high current threshold.

Figure 5:
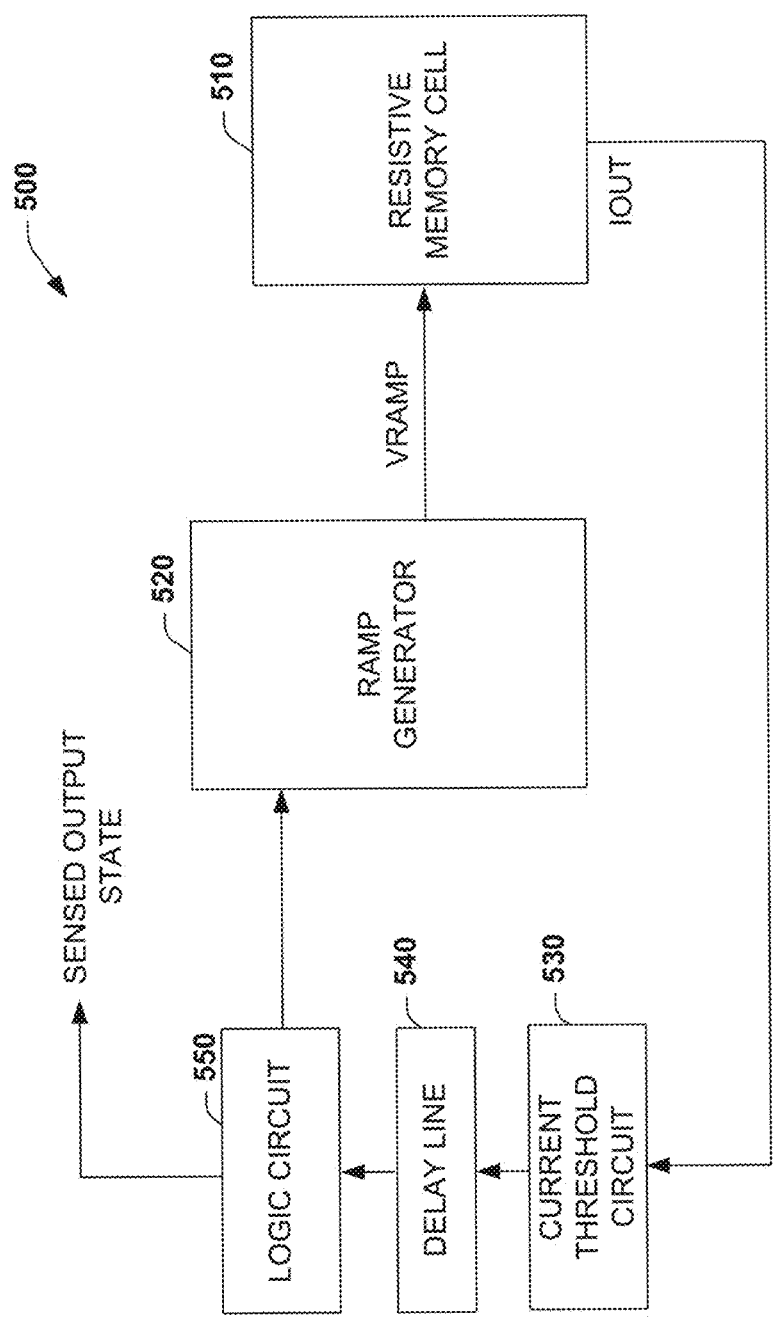
FIG. 5 illustrates an example of an alternative circuit for reading data from a resistive memory cell utilizing a varying sensing voltage applied to the cell.

FIG. 5 illustrates an example of an alternative circuit 500 for reading data from a resistive memory cell 510 utilizing a varying sensing voltage applied to the cell. The circuit 500 includes a resistive memory cell a ramp generator 520 to apply a voltage ramp (VRAMP) to the resistive memory cell 510. A current threshold circuit 530 receives a current output (IOUT) from the resistive memory cell 510 in response to the voltage ramp VRAMP. The current threshold circuit 530 compares the current output IOUT from the resistive memory cell 510 to a high threshold current and a low threshold current, for example. A delay line 540 delays a logic event signal corresponding to the current output IOUT reaching the low threshold current. A logic circuit 550 receives the logic event signal via the delay line 540 in response to the current output IOUT reaching the low threshold current. The logic circuit 550 determines a state of the resistive memory cell 510 as one resistance state if the current output IOUT reaches the low threshold current before the logic event propagates through the delay line 540. The logic circuit 550 determines the state of the resistive memory cell 510 as another resistance state if the logic event propagates though the delay line 5409 before the current output IOUT reaches a high threshold current.

What have been described above are examples. It is, of course, not possible to describe every conceivable combination of components or methods, but one of ordinary skill in the art will recognize that many further combinations and permutations are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A circuit, comprising:
a ramp generator to apply a voltage ramp to a resistive memory cell; and
a sensing circuit to enable the ramp generator and to monitor a current output received from the resistive memory cell in response to the voltage ramp,
wherein the sensing circuit compares the current output to a predetermined current threshold to determine a state of the resistive memory cell, and
wherein the sensing circuit comprises a current threshold circuit that compares a sample of the current output to a predetermined high threshold current and compares the sample of the current output to a predetermined low threshold current, the sensing circuit determining the state of the resistive memory cell based on the comparisons.

2. The circuit of claim 1, wherein the sensing circuit further comprises a sample and hold circuit to provide sneak current subtraction from the resistive memory cell as the voltage ramp is applied to the resistive memory cell.

3. The circuit of claim 1, further comprising a delay line to delay a given logic event in response to the comparison between the sample of the current output and the predetermined low threshold current.

4. The circuit of claim 3, wherein the sensing circuit further comprises a logic circuit to receive the given logic event that propagates though the delay line and to receive a comparison output based on the comparison between the sample of the current output and the predetermined high threshold current.

5. The circuit of claim 4, wherein the logic circuit is to determine the state of the resistive memory cell as a low resistance state if the sample of the current output reaches the predetermined high threshold current before the given logic event propagates through the delay line, and
wherein the logic circuit is to determine the state of the resistive memory cell as a high resistance state if the given logic event propagates though the delay line before the current output reaches the predetermined high threshold current.

6. The circuit of claim 5, wherein the logic circuit is to disable the ramp generator in response to the state of the resistive memory cell being determined.

7. The circuit of claim 6, wherein the logic circuit includes a latch to capture a logic state of the resistive memory cell based on the determined resistance state of the resistive memory cell.

8. The circuit of claim 1, wherein the resistive memory cell is configured as one of plurality of resistive memory cells in horizontal cross-point array.

9. A circuit, comprising:
a resistive memory cell;
a ramp generator to apply a voltage ramp to the resistive memory cell;
a current threshold circuit that receives a current output from the resistive memory cell in response to the voltage ramp, wherein the current threshold circuit compares the current output from the resistive memory cell to a high threshold current and a low threshold current;
a delay line to delay a logic event signal corresponding to the current output reaching the low threshold current; and
a logic circuit that receives the logic event signal via the delay line in response to the current output reaching the low threshold current, the logic circuit to determine a state of the resistive memory cell as one resistance state if the current output reaches the low threshold current before the logic event propagates through the delay line, and the logic circuit to determine the state of the resistive memory cell as another resistance state if the logic event propagates though the delay line before the current output reaches a high threshold current.

10. The circuit of claim 9, wherein the logic circuit disables the ramp generator in response to the state of the resistive memory cell being determined.

11. The circuit of claim 10, wherein the logic circuit further comprises a latch to capture a logic state of the resistive memory cell based on the determined resistance state of the resistive memory cell.

12. The circuit of claim 9, wherein the voltage ramp increases linearly from a starting voltage to a read voltage.

13. A method, comprising:
applying, via a controller, a voltage ramp to a resistive memory cell;
monitoring, via the controller, a current output received from the resistive memory cell in response to the voltage ramp;
comparing, via the controller, the current output to a predetermined low current threshold and a predetermined high current threshold to determine a state of the resistive memory cell;
delaying through a delay line a logic event responsive to the comparing the current output to the predetermined low current threshold;
determining a low resistance state if the current output reaches the predetermined high current threshold before the logic event propagates through the delay line; and
determining a high resistance state if the logic event propagates though the delay line before the current output reaches the predetermined high current threshold.

* * * * *